(12) United States Patent
Kato et al.

(10) Patent No.: US 7,481,886 B2
(45) Date of Patent: Jan. 27, 2009

(54) PLASMA PROCESS SYSTEM AND PLASMA PROCESS METHOD

(75) Inventors: Yoshihiro Kato, Tsukui-gun (JP); Tadashi Goto, Tsukui-gun (JP); Hikaru Yoshitaka, Tsukui-gun (JP); Makoto Aoki, Tsukui-gun (JP)

(73) Assignee: Tokyo Electron Limited, Tokyo (JP)

( * ) Notice: Subject to any disclaimer, the term of this patent is extended or adjusted under 35 U.S.C. 154(b) by 50 days.

(21) Appl. No.: 10/623,866

(22) Filed: Jul. 22, 2003

(65) Prior Publication Data
US 2004/0134611 A1 Jul. 15, 2004

Related U.S. Application Data

(63) Continuation-in-part of application No. PCT/JP02/00429, filed on Jan. 22, 2002.

(30) Foreign Application Priority Data
Jan. 22, 2001 (JP) ............... 2001-13570
Jan. 23, 2001 (JP) ............... 2001-14011

(51) Int. Cl.
*C23C 16/455* (2006.01)
*C23C 16/00* (2006.01)

(52) U.S. Cl. ............. 118/715; 156/345.34; 156/345.33

(58) Field of Classification Search ............. 118/715; 156/345.33, 345.34
See application file for complete search history.

(56) References Cited

U.S. PATENT DOCUMENTS

| 4,590,042 A | 5/1986 | Drage |
| 4,820,371 A * | 4/1989 | Rose ............... 156/345.51 |
| 5,266,153 A * | 11/1993 | Thomas .................. 134/1.1 |
| 5,558,717 A * | 9/1996 | Zhao et al. ................ 118/715 |
| 5,595,606 A * | 1/1997 | Fujikawa et al. ........... 118/725 |
| 5,884,009 A * | 3/1999 | Okase ....................... 392/418 |
| 5,888,907 A * | 3/1999 | Tomoyasu et al. ......... 438/714 |
| 5,958,140 A * | 9/1999 | Arami et al. ................ 118/725 |
| 6,086,677 A | 7/2000 | Umotoy et al. |

(Continued)

FOREIGN PATENT DOCUMENTS

| EP | 1 134 789 A2 | 9/2001 |
| JP | 04-237123 | 8/1992 |
| KR | 2003001624 A * | 1/2003 |
| WO | WO 01/03159 A1 | 1/2001 |
| WO | WO 01/61071 A2 | 8/2001 |
| WO | WO 02/23964 A1 | 3/2002 |

OTHER PUBLICATIONS

European Search Report Dated Nov. 7, 2005 (Three (3) pages).
Japanese Office Action dated Jul. 25, 2006 (four (4) pages) with an English translation.

*Primary Examiner*—Jeffrie R Lund
(74) *Attorney, Agent, or Firm*—Crowell & Moring LLP

(57) ABSTRACT

A first channel is formed in the side of a first diffusion plate which is on that side of a gas inlet tube and a recess is formed in the side which is on that side of an electrode plate. The first channel and the recess communicate with each other through a plurality of inlet ports. The first channel and the inlet ports form a gas flow passage L which leads to the recess from the gas inlet tube. As a process gas supplied from the gas inlet tube passes through the gas flow passage L, it is supplied, dispersed, to a hollow portion formed between the recess and the electrode plate.

12 Claims, 13 Drawing Sheets

U.S. PATENT DOCUMENTS

| | | | |
|---|---|---|---|
| 6,123,775 A * | 9/2000 | Hao et al. ................... 118/724 |
| 6,126,753 A * | 10/2000 | Shinriki et al. .............. 118/715 |
| 6,148,761 A | 11/2000 | Majewski et al. |
| 6,206,972 B1 * | 3/2001 | Dunham .................... 118/715 |
| 6,245,192 B1 * | 6/2001 | Dhindsa et al. ........ 156/345.34 |
| 6,251,188 B1 * | 6/2001 | Hashimoto et al. .......... 118/715 |
| 6,294,026 B1 * | 9/2001 | Roithner et al. ............ 118/715 |
| 6,368,987 B1 * | 4/2002 | Kopacz et al. .............. 438/788 |
| 6,415,736 B1 * | 7/2002 | Hao et al. ................ 118/723 E |
| 6,444,039 B1 * | 9/2002 | Nguyen .................... 118/715 |
| 6,508,197 B1 * | 1/2003 | Omstead et al. ............. 118/715 |
| 6,533,867 B2 * | 3/2003 | Doppelhammer .......... 118/715 |
| 6,537,419 B1 * | 3/2003 | Kinnard ................ 156/345.34 |
| 6,800,139 B1 * | 10/2004 | Shinriki et al. .............. 118/715 |
| 7,306,829 B2 * | 12/2007 | Turlot et al. ................ 427/569 |
| 2001/0010207 A1 * | 8/2001 | Yamamoto et al. .. 118/723 MW |
| 2002/0005442 A1 * | 1/2002 | Watanabe et al. ........... 239/596 |
| 2002/0017243 A1 * | 2/2002 | Pyo ........................... 118/715 |
| 2003/0010452 A1 * | 1/2003 | Park et al. .............. 156/345.33 |
| 2003/0124842 A1 * | 7/2003 | Hytros et al. ............... 438/680 |
| 2003/0165620 A1 * | 9/2003 | Wakabayashi et al. .................... 427/255.391 |
| 2003/0221780 A1 * | 12/2003 | Lei et al. ............... 156/345.29 |
| 2004/0103844 A1 * | 6/2004 | Chou et al. ................. 118/715 |
| 2004/0112540 A1 * | 6/2004 | Larson et al. .......... 156/345.33 |
| 2004/0123800 A1 * | 7/2004 | Schlottmann ............... 118/715 |
| 2004/0134611 A1 * | 7/2004 | Kato et al. ............. 156/345.33 |
| 2004/0231585 A1 * | 11/2004 | Yamasaki et al. ........... 118/715 |
| 2005/0011447 A1 * | 1/2005 | Fink .......................... 118/715 |
| 2005/0106319 A1 * | 5/2005 | Jurgensen et al. ......... 427/248.1 |
| 2008/0069966 A1 * | 3/2008 | Otsuki ........................ 427/453 |
| 2008/0070032 A1 * | 3/2008 | Otsuki ........................ 428/332 |
| 2008/0093341 A1 * | 4/2008 | Turlot et al. .................. 216/71 |

* cited by examiner

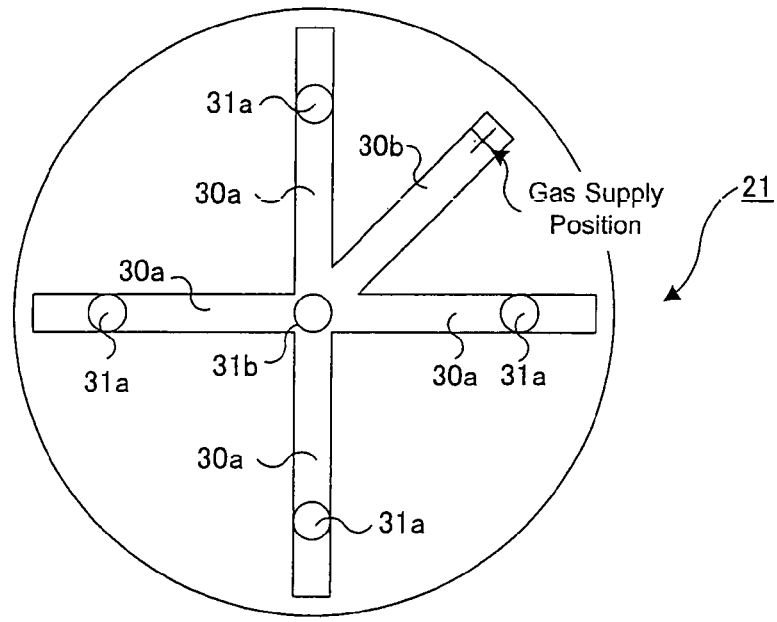
FIG.3    Diagram As Seen From Arrow A
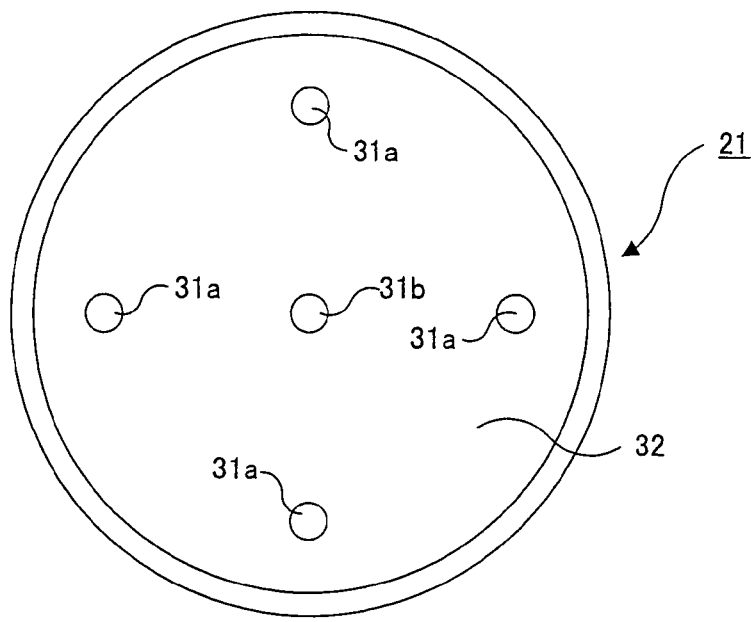
FIG.4    Diagram As Seen From Arrow B

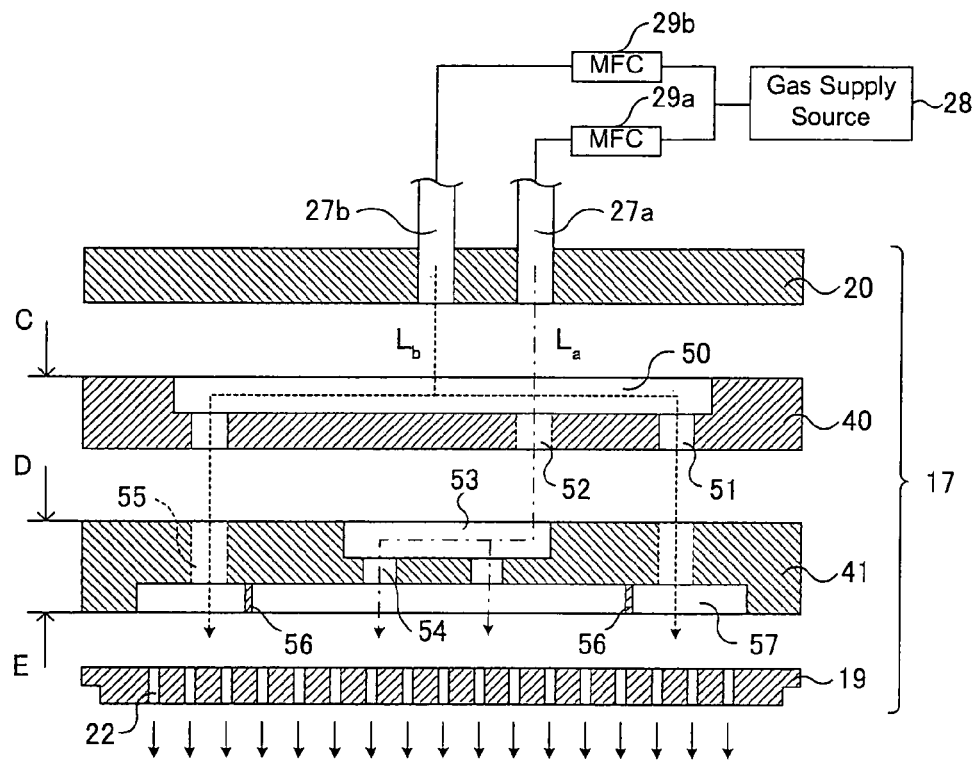
FIG. 5
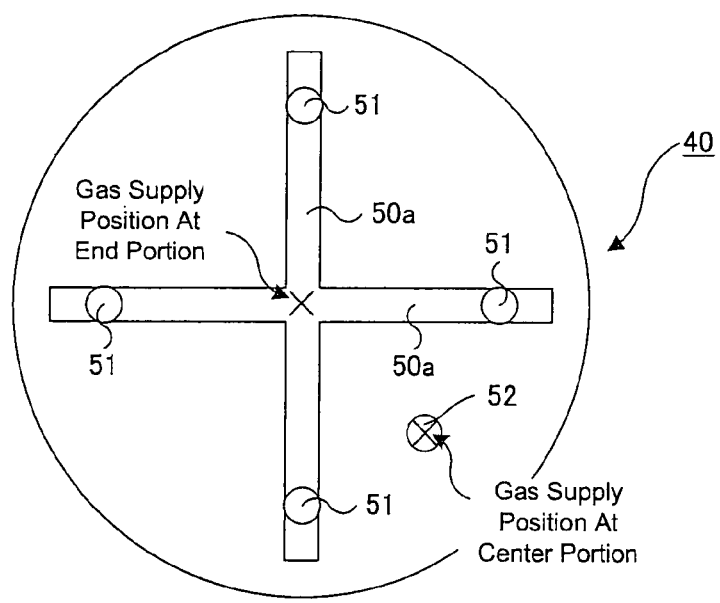
FIG. 6   Diagram As Seen From Arrow C

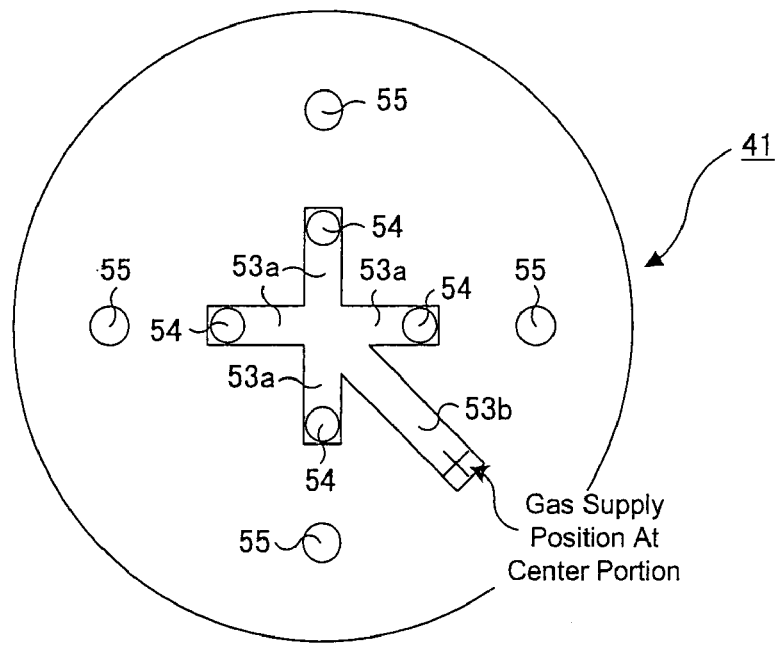
FIG. 7   Diagram As Seen From Arrow D
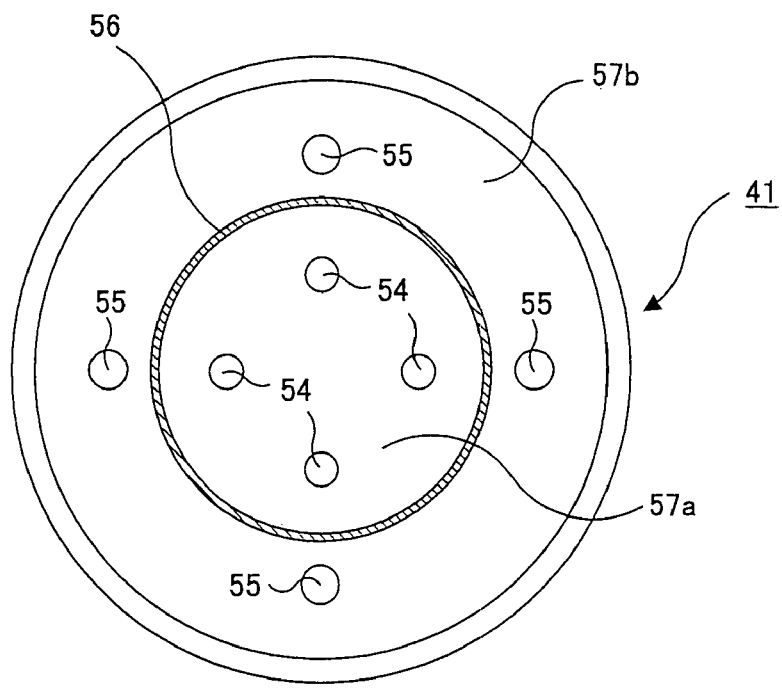
FIG. 8   Diagram As Seen From Arrow E

FIG.11

| Gas Species | SiH4/O2/Ar | SiF4/SiH4/O2/Ar | SiH4/CH4/Ar | SiH4/N2/Ar | SiH4/N2/CH4/Ar | C6F6/Ar | 3MS/(Ar or He) | 3MS/O2/Ar |
|---|---|---|---|---|---|---|---|---|
| Gas Flow Rate (sccm) | 200/500/50 | 120/80/400/50 | 10/20/200 | 45/175/200 | 10/10/15/200 | 30/200 | 60/200 | 60/15/200 |
| Center Area : End Area | 1:1 | 1:4 | 1:4 | 1:2 | 1:4 | 1:1.5 | 1:0.25 | 1:0.25 |
| Pressure (Pa) | 0.25 | 1.0 | 2.0 | 1.0 | 2.0 | 30 | 30 | 50 |
| Upper Electrode Power (kW) | 2.7 | 2.7 | 1.0 | 1.0 | 1.0 | 1.0 | 0.6 | 0.6 |
| Lower Electrode Power (kW) | 1.0 | 1.0 | 0.5 | 0.5 | 0.5 | 0.2 | 0.1 | 0.1 |
| Substrate Teperature (°C) | 350-390 | 350-390 | 350-390 | 350-390 | 350-390 | 350-390 | 250-400 | 250-400 |

| | Substitutable Gases |
|---|---|
| SiH4 | TEOS, Si2H6 |
| SiF4 | SiH2F2, Si2F6 |
| CH4 | C2H6, C3H8, C2H4, C2H2 |
| C6F6 | CF4, C2F6, C3F8, C5F8 |
| N2 | N2O, NO |
| O2 | N2O, NO, CO, CO2, O3 |
| (CH3)3SiH Trimethylsilane | (CH3)SiH3, (CH3)2SiH2, (CH3)4Si, DMDM, TMCTS, V3D3, HMDSO, OMCATS |

DMDM: Dimethyldimethoxysilane
TMCTS: 1,3,5,7-Tetramethylcyclotetrasiloxane
V3D3: 1,3,5-Trimethyl-1,3,5-trivinylcyclotrisiloxane
HMDSO: Hexamethoxydisiloxane
OMCTS: Octamethylcyclotetrasiloxane

FIG.12

| He(C/E) (sccm) | HN3(C/E) (sccm) | O2(C/E) (sccm) | T/B (w) | Pressure (Torr) | Temperature (°C) | Time (minute) | Thickness (Angustrom) | Unification (1sgma%) |
|---|---|---|---|---|---|---|---|---|
| 300/300 | 40/40 | --/-- | 700/0 | 2.9 | 350 | 1.0 | 500 | 2.5 |
| 150/150 | --/-- | --/-- | 400/0 | 4.5 | 350 | 1.5 | 500 | 2.1 |
| 150/150 | --/-- | 7.5/7.5 | 400/0 | 4.5 | 350 | 9.0 | 5000 | 4.0 |

FIG. 15

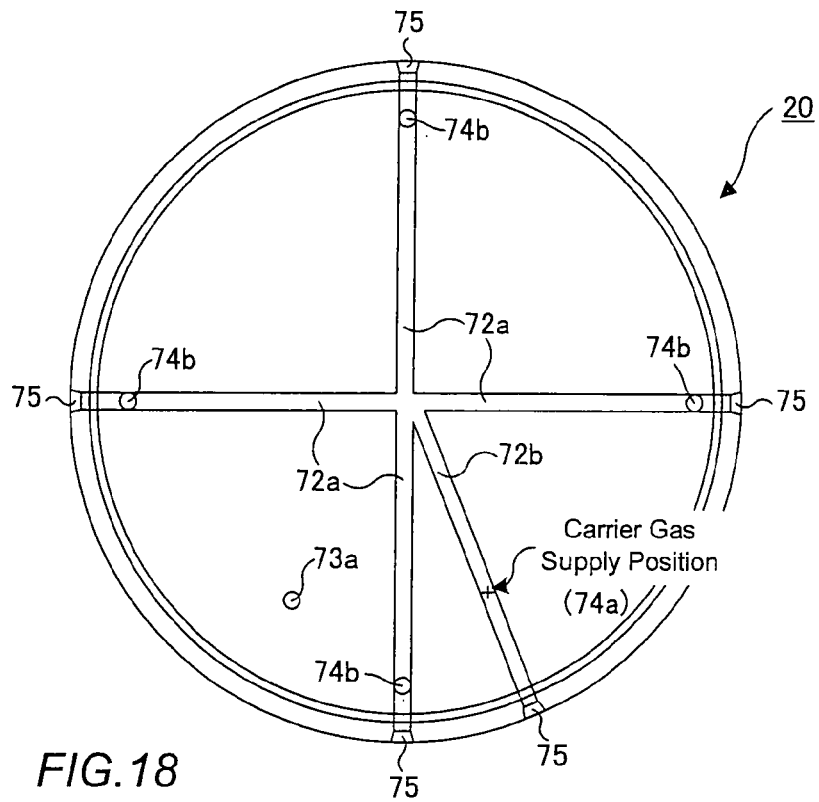
FIG.18  Cross-Section As Seen From Arrow A
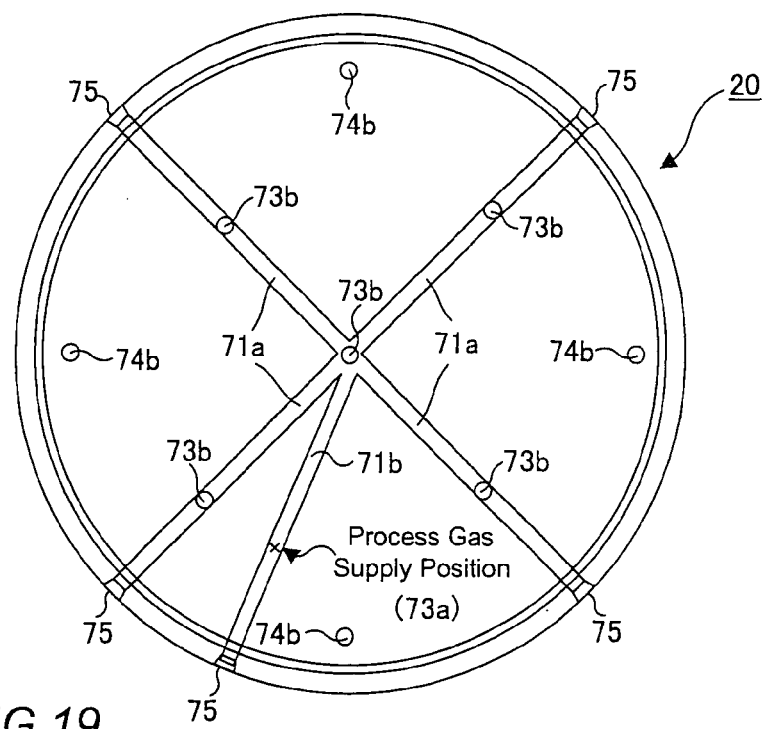
FIG.19  Cross-Section As Seen From Arrow B

PLASMA PROCESS SYSTEM AND PLASMA PROCESS METHOD

BACKGROUND OF THE INVENTION

1. Field of the Invention

The present invention relates to a plasma process system and a plasma process method which perform processes, such as film deposition and etching, using a plasma.

2. Description of Related Art

A plasma process system which processes the surface of a substrate, such as a semiconductor wafer, using a plasma is used in a fabrication process for a liquid crystal display or the like. As plasma process systems, there are, for example, a plasma etching system which performs etching on a substrate and a plasma CVD system which performs chemical vapor deposition (Chemical Vapor Deposition: CVD). Of them, a parallel plate plasma process system is widely used because it has an excellent process uniformity and its system structure is relatively simple.

A parallel plate plasma process system has two parallel plate electrodes faces each other vertically in parallel to each other. A substrate is mounted on a lower electrode of the two electrodes. The upper electrode has an electrode plate facing the lower electrode and having multiple gas holes, and has a so-called shower head structure. The upper electrode is connected to a supply source for a process gas so that at the time of processing, the process gas is supplied between two electrodes through the gas holes in the electrode plate. The process gas supplied between the electrodes is turned into a plasma by the application of high-frequency power to the electrodes, and the surface of the substrate is processed by the plasma.

For the plasma process system to process the substrate surface with high uniformity, it is important to control the supply of the process gas from the individual gas holes with a high accuracy. In case where gas supply from the gas holes is not uniform, for example, the film thickness distribution on the substrate surface undergone film deposition becomes uneven.

The upper electrode of the shower head structure has a hollow diffusion portion inside. The diffusion portion is provided in such a way as to cover one side of the electrode plate and the process gas is diffused into multiple gas holes by the diffusion portion. To control the supply of the process gas from the gas holes in this structure, it is important to lead the gas to the gas holes by controlling the diffusion of the process gas at the diffusion portion.

To control the diffusion of the process gas at the diffusion portion, for example, a structure which separates the diffusion portion 21 into a plurality of areas and supplies the process gas to the individual areas has been developed. According to this structure, it is possible to control the amount of the process gas to be ejected from the gas holes that communicate with the individual areas by adjusting the amount of the process gas to be supplied to the individual areas. Accordingly, a process with high uniformity can be performed on the substrate surface.

In case where the structure is used, however, pipes respectively connected to a plurality of diffusion areas are required This increases the number of parts of the system, complicating the system structure, increasing the manufacturing cost and lowering the maintenanceability, such as maintenance. As apparent from the above, there have been no plasma process systems that could perform a process with high uniformity on the substrate surface.

SUMMARY OF THE INVENTION

In view of the above-described situation, it is therefore an object of the invention to provide a process system and a process method which can perform a process with high uniformity on a subject to be processed.

It is also an object of the invention to provide a process system and a process method which can supply a process gas to a subject to be processed with a high controllability with a simple system structure.

To achieve the objects, a process system according to the first aspect of the invention comprises:
a chamber;
a supply plate which has a plurality of gas holes and supplies a process gas into the chamber through the gas holes;
a first diffusion portion which diffuses the gas in a direction approximately horizontal to a major surface of the supply plate; and
a second diffusion portion which leads the gas diffused by the first diffusion portion to the gas holes.

In the process system according to the first sect, the first diffusion portion may be comprised of a disk-like member having a plurality of grooves formed in one side thereof and communicating with one another and through holes formed in the plurality of grooves and led to the other side.

In the process system according to the first aspect, for example, at least one of the grooves may be provided at positions to which the gas is supplied, and, for example, the gas supplied to the at least one groove may be dispersed to the other grooves and flow out to the other side through the through holes respectively provided in the other grooves.

In the process system according to the first aspect, for example, the second diffusion portion may be comprised of a disk-like member having a groove formed in one side thereof and placed over the supply plate to form a hollow portion between itself and the one side and through holes formed in the groove and led to the other side, and, for example, the gas from the first diffusion portion may be supplied to the hollow portion via the through holes.

In the process system according to the first aspect, the disk-like member constituting the second diffusion portion may be made of, for example, a same member as the disk-like member constituting the first diffusion portion, and, for example, the groove constituting the second diffusion portion and the grooves constituting the first diffusion portion may be formed in opposite sides of the member.

The process system according to the first aspect, for example, may further comprise a partition member which is provided in the groove constituting the second diffusion portion and separate the hollow portion into a plurality of areas, and, for example, the first diffusion portion may supply the gas, dispersed, to the plurality of areas.

In the process system according to the first aspect, for example, the first diffusion portion may be comprised of a cylindrical member having a plurality of linear holes communicating with one another, formed by boring and sealing end portions of bored portions, for example, at least one of the holes may be supplied with the gas and the gas supplied to the at least one hole may be dispersed to the other holes.

In the process system according to the first aspect, for example, the cylindrical member may have connection holes provided in such a way as to be led to the other holes from its one side, and the gas supplied to the other holes may be supplied to, for example, the second diffusion portion from the connection holes.

To achieve the objects, a process method according to the second aspect of the invention uses a process system comprising a chamber and a supply plate which has a plurality of gas holes and supplies a process gas into the chamber through the gas holes, and comprises:

a first diffusion step which diffuses the gas in a direction approximately horizontal to a major surface of the supply plate; and a second diffusion step which leads the gas diffused in the first diffusion step to the gas holes.

BRIEF DESCRIPTION OF THE DRAWINGS

FIG. 3 shows a diagram of the upper electrode shown in FIG. 2 as seen from an arrow A.

FIG. 4 shows a diagram of the upper electrode shown in FIG. 2 as seen from an arrow B.

FIG. 5 shows an exploded diagram of an upper electrode according to a second embodiment.

FIG. 6 shows a diagram of the upper electrode shown in FIG. 5 as seen from an arrow C.

FIG. 7 shows a diagram of the upper electrode shown in FIG. 5 as seen from an arrow D.

FIG. 8 shows a diagram of the upper electrode shown in FIG. 5 as seen from an arrow E.

FIG. 11 shows an example of film deposition conditions for various kinds of deposition seeds.

FIG. 12 shows a substitutable gas.

FIG. 15 is a diagram for explaining conditions of the process for forming the semiconductor device shown in FIG. 13.

FIG. 18 shows a cross-sectional view of the upper electrode shown in FIG. 16 as seen from an arrow A.

FIG. 19 shows a cross-sectional view of the upper electrode shown in FIG. 16 as seen from an arrow B.

DETAILED DESCRIPTION OF THE PREFERRED EMBODIMENTS

Process systems according to embodiments of the invention will now be described below with reference to the accompanying drawings. In the following embodiments to be illustrated below, a parallel plate plasma process system which forms a silicon fluoride oxide (SiOF) film on a semiconductor wafer (hereinafter "wafer W") by CVD (Chemical Vapor Deposition) will be described as an example.

First Embodiment

Figure 1:
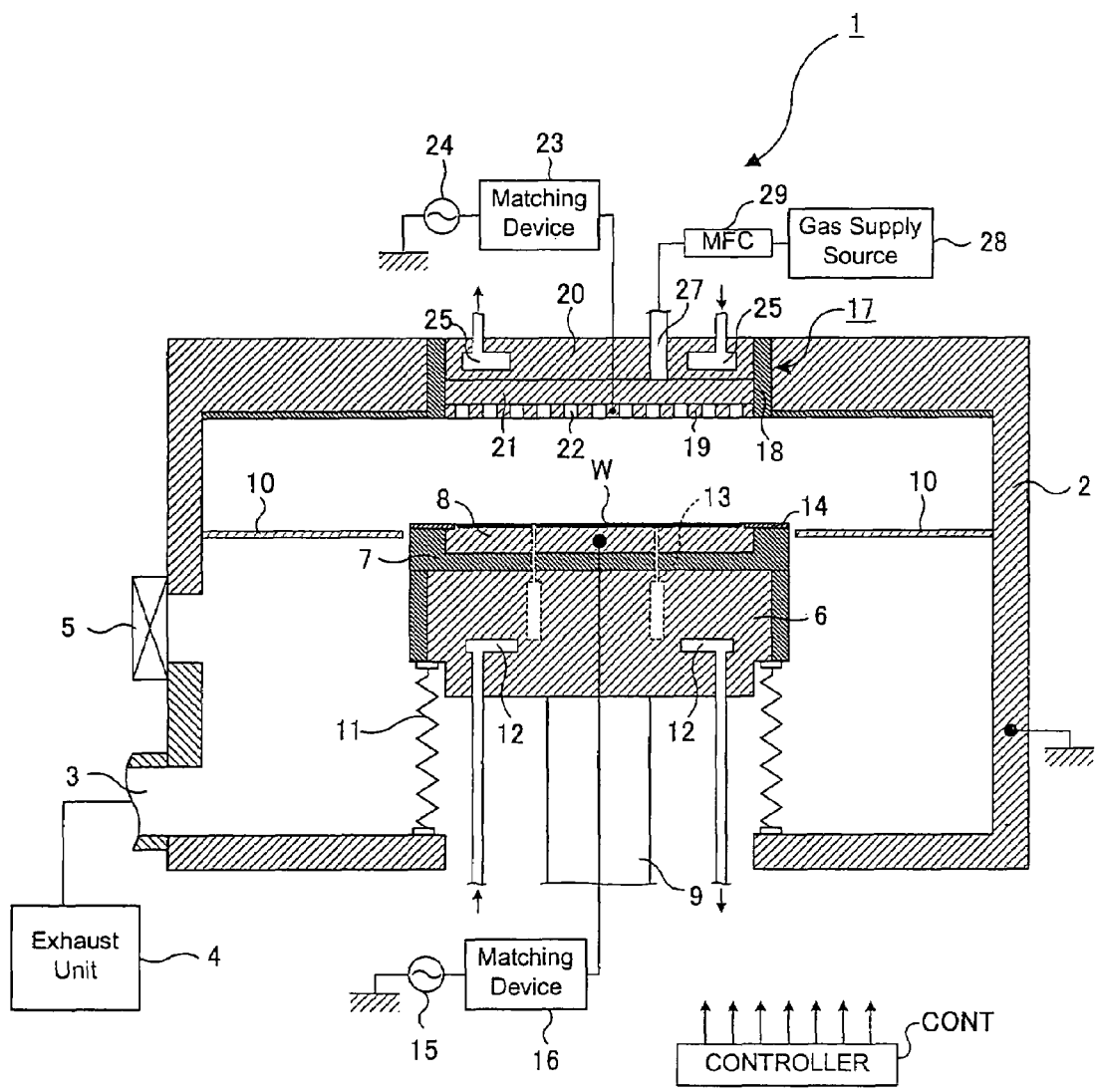
FIG. 1 is a diagram illustrating the structure of a plasma process system according to a first embodiment.

FIG. 1 shows a cross-sectional view of a plasma process system 1 according to the first embodiment of the invention As shown in FIG. 1, the plasma process system 1 has an approximately cylindrical chamber 2. The chamber 2 is made of a conductive material such as aluminum, subjected to an alumite process (anodic oxidation). The chamber 2 is grounded.

An exhaust port 3 is provided in the bottom portion of the chamber 2. An exhaust unit 4 which comprises a turbo molecular pump or the like is connected to the exhaust port 3. The exhaust unit 4 vacuums inside the chamber 2 to a predetermined depressurized atmosphere, e.g., 0.01 Pa or lower. A gate valve 5 which is openable and closable airtightly is provided on a side wall of the chamber 2. With the gate valve 5 open, transfer-in and transfer-out of a wafer W is performed between the chamber 2 and an adjoining loadlock chamber (not shown).

A susceptor support 6 with an approximately columnar shape stands upright from the bottom portion of the chamber 2. A susceptor 8 is provided on the susceptor support 6. A wafer W is placed on the top surface of the susceptor 8. The susceptor support 6 and the susceptor 8 are insulated by an insulator 7 of ceramics or the like. The susceptor support 6 is connected via a shaft 9 to an elevation mechanism (not shown) provided under the chamber 2 and is elevatable up and down in the chamber 2.

The wafer W transferred from the gate valve 5 is placed on the susceptor 8 at a descended position. At the ascended position of the susceptor 8, a plasma process is performed on the wafer W.

An annular disk-shaped baffle plate 10 is attached to the susceptor support 6 or the inner wall of the chamber 2. The baffle plate 10 is provided little lower than the susceptor 8. The baffle plate 10 is made of a conductor, such as aluminum. The baffle plate 10 has an unillustrated slit The slit inhibits passage of a plasma while passing a gas. Accordingly, the baffle plate 10 confines the plasma in the upper portion of the chamber 2.

The lower portion of the susceptor support 6 is covered with a bellows 11 made of, for example, stainless steel. The upper end and lower end of the bellows 11 are respectively fastened to the lower portion of the susceptor support 6 the bottom of the chamber 2 by screws. The bellows 11 stretches and contracts with the up and down elevation of the susceptor support 6 to retain the airtightness in the chamber 2.

A lower refrigerant passage 12 is provided inside the susceptor support 6. A refrigerant circulates in the lower refrigerant passage 12. The lower refrigerant passage 12 keeps the susceptor 8 and wafer W at a desired temperature.

A lift pin 13 is provided on the susceptor support 6 in such a way as to penetrate the insulator 7 and the susceptor 8. The lift pin 13 can be elevated up and down by a cylinder (not shown). The elevation of the lift pin 13 enables the transfer of the wafer W to an unillustrated transfer arm.

The susceptor 8 is comprised of a disk-shaped member made of a conductor, such as aluminum. An unillustrated electrostatic chuck having approximately the same shape as the wafer W is provided on the susceptor 8. As a DC voltage is applied to the electrostatic chuck, the wafer W is secured onto the susceptor 8.

A focus ring 14 is provided at the periphery of the susceptor 8 in such a way as to enclose the susceptor 8. The focus ring 14 is made of, for example, ceramics. The focus ring 14 allows a plasma active seed to be effectively incident on the wafer W placed inside it.

The susceptor 8 functions as a lower electrode. High-frequency power with a frequency in a range of 0.1 to 13 MHz is supplied to the susceptor 8 from a first high-frequency power supply 15 via a first matching device 16.

An upper electrode 17 is provided at the upper portion of the susceptor 8 in such a way as to face the susceptor 8 in parallel. The upper electrode 17 is provided at the upper portion of the chamber 2 via an insulator 18. The upper electrode 18 comprises an electrode plate 19, an electrode support 20 and a first diffusion plate 21.

The electrode plate 19 is made of a conductive material, such as aluminum. The electrode plate 19 has multiple gas holes 22 penetrating the electrode plate 19. A second high-frequency power supply 24 is connected to the electrode plate 19 via a second matching device 23. The second high-frequency power supply 24 applies high-frequency power of 13 to 150 MHz to the electrode plate 19. As the high-frequency electrode is applied to the susceptor 8 (lower electrode) and the upper electrode 17, a plasma is generated therebetween.

The first diffusion plate 21 and the electrode plate 19 are held on the electrode support 20. An upper refrigerant passage 25 is provided inside the electrode support 20. The refrigerant circulates in the upper refrigerant passage 25. The upper refrigerant passage 25 keeps the upper electrode 17 at a desired temperature.

As a gas supply tube 27 is connected to the electrode support 20, the support 20 is connected to a gas supply source 28. A process gas which is used for deposition of an SiOF film is supplied from the gas supply source 28. The process gas is composed of a gas mixture of, for example, silane tetrafluoride ($SiF_4$), silane ($SiH_4$), oxygen ($O_2$) and argon (Ar).

A flow-rate control device 29, such as a mass flow controller (MFC), is provided between the gas supply source 28 and the gas supply tube 27. The gas supply source 28 supplies the process gas whose flow rate is adjusted by the flow-rate control device 29 into the chamber 2.

The first diffusion plate 21 is comprised of a disk-like member made of a conductive material, such as aluminum. The first diffusion plate 21 is sandwiched between the electrode plate 19 and the gas holes 22 and has approximately the same diameter as that of the electrode plate 19. The first diffusion plate 21 diffuses the process gas supplied from the gas supply tube 27 to one side of the electrode plate 19. The diffused process gas is supplied to the multiple gas holes 22 of the electrode plate 19. Accordingly, the process gas is supplied to the top surface of the wafer W through the gas holes 22.

Figure 2:
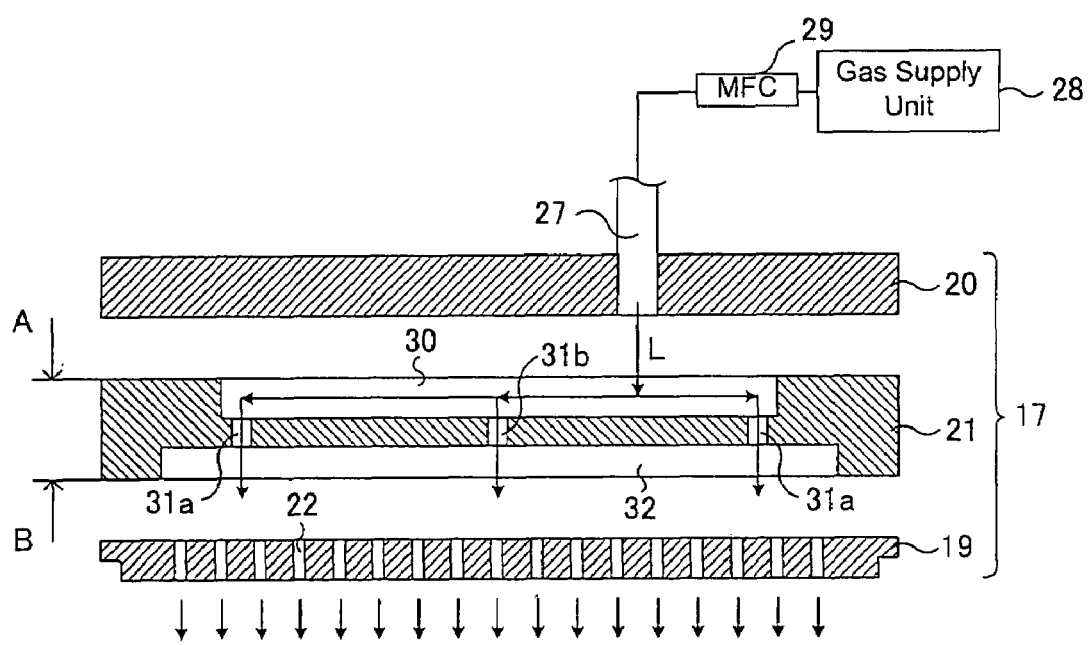
FIG. 2 shows an enlarged diagram of an upper electrode shown in FIG. 1.

An exploded cross-sectional view of the upper electrode 17 is shown in FIG. 2. As shown in FIG. 2, formed in the first diffusion plate 21 are a first channel 30 formed in one side as a groove of a given depth, first and second inlet ports 31a and 31b which penetrate the first diffusion plate 21, and a first recess 32 formed in the other side as a recess of a given depth. The first channel 30, the first and second inlet ports 31a and 31b and the first recess 32 can be formed easily by cutting, drilling or the like. A gas flow passage L comprised of the first channel 30 and the first and second inlet ports 31a and 31b is formed inside the upper electrode 17.

The first channel 30 communicates with the gas supply tube 27 and is laid out in such a way as to receive the supply of the process gas from the gas supply source 28. The first and second inlet ports 31a and 31b connect the first channel 30 to the first recess 32. Therefore, the process gas supplied from the gas supply tube 27 passes through the gas flow passage L, is diffused in the horizontal direction as indicated by the arrow in FIG. 2 and is supplied to the first recess 32.

The diffused process gas is supplied to a hollow portion formed between the electrode plate 19 and the first recess 32 of the first diffusion plate 21. The diffused process gas supplied to the hollow portion (first recess 32) is further diffused in the hollow portion and is supplied to the multiple gas holes 22 of the electrode plate 19 with high uniformity relating to pressure or the like. Therefore, the process gas is supplied to the entire top surface of the wafer W almost evenly from the multiple gas holes 22. This can ensure a process with high uniformity, such as acquisition of an excellent film deposition distribution.

The details of the structure of the first diffusion plate 21 will be discussed below. FIG. 3 shows a diagram of the first diffusion plate 21 shown in FIG. 2 as seen from an arrow A. As shown in FIG. 3, the first channel 30 formed in one side of the first diffusion plate 21 comprises four first grooves 30a, ..., 30a and a single second groove 30b.

The first grooves 30a, ..., 30a extend radially from nearly the center of the first diffusion plate 21 in such a way as to be approximately at right angles to one another. The first grooves 30a, ..., 30a have almost the same lengths and are connected at the center. The second groove 30b is formed between the adjoining first grooves 30a, 30a. The second groove 30b has almost the same length as the first grooves 30a, ..., 30a and is connected to the first grooves 30a, ..., 30a at the center.

The first inlet ports 31a are respectively provided inside the first grooves 30a, ..., 30a at equidistances from the center. The second inlet port 31b is provided at the center. The first and second inlet ports 31a and 31b are provided, penetrating both sides of the first diffusion plate 21.

The second groove 30b is provided at the position where the process gas from the gas supply tube 27 is supplied. That is, for example, the second groove 30b is arranged directly below the position where the gas supply tube 27 is connected to the electrode support 20. The process gas supplied toward the first diffusion plate 21 from the gas supply tube 27 is received at the second groove 30b. Thereafter, the process gas flows into the second groove 30b, flows to the other side via the second inlet port 31b and flows, evenly dispersed, to the four first grooves 30a. The process gas that flows in the first grooves 30a reaches the first inlet ports 31a and is supplied to the first recess 32 on the other side via the second inlet port 31b.

FIG. 4 shows a diagram of the first diffusion plate 21 shown in FIG. 2 as seen from an arrow B. As shown in FIG. 4, the approximately circular first recess 32 is formed in the other side of the first diffusion plate 21. The first recess 32 is formed in a predetermined depth in almost the entire surface of the first diffusion plate 21. As the first diffusion plate 21 and the electrode plate 19 are laid out one on the other, forming a hollow portion with the first recess 32.

The process gas that is supplied to one side of the first diffusion plate 21 and diffused in the first channel 30 is supplied to the hollow portion (first recess 32) on the other side via the first inlet ports 31a, ..., 31a and the second inlet port 31b. The process gas is diffused inside the hollow portion and is supplied to the gas holes 22. Accordingly, the process gas is supplied to the top surface of the wafer W from the gas holes 22 with high uniformity.

A controller CONT shown in FIG. 1 comprises a microprocessor, a memory, and the like. The controller CONT acquires information regarding temperature, pressure, flow rate, timing, etc. from an unillustrated sensor, and performs a process by controlling the valve, heater, flow-rate control device, power source, robot and the like of the plasma process system 1 in accordance with a preset process recipe.

The operation of the thus constituted plasma process system 1 at the time of film deposition will be discussed referring to the drawings. The operation illustrated below is one example and may be of any type as long as the structure obtains similar resultant works.

The control of the process is performed by the controller CONT. However, reference to the controller CONT will not be made for its every operation, but the process itself will be mainly described in the explanation below in order to facilitate understanding.

First, the wafer W is loaded into the chamber 2. The wafer W is placed on the lift pin 13 protruding from the top surface of the susceptor 8 with the susceptor support 6 at the descended position. Next, as the lift pin 13 is lifted down, the wafer W is placed on the susceptor 8 and is secured by electrostatic chuck. Then, the gate valve 5 is closed and inside the chamber 2 is vacuumed to a predetermined degree of vacuum by the exhaust unit 4. Thereafter, the susceptor support 6 is lifted up to a process position. In this state, the susceptor 8 is at a predetermined temperature, e.g., 50° C., and the interior of the chamber 2 is set to a high vacuum state, e.g., 0.01 Pa, by the exhaust unit 4.

Thereafter, the process gas comprised of, for example, $SiF_4$, $SiH_4$, $O_2$, $NF_3$, $NH_3$ gas and Ar gas is supplied to the gas supply tube 27 as it is controlled to a predetermined flow rate by the flow-rate control device 29. the gas mixture is dispersed sufficiently by the diffusion plate 21 and is ejected toward the wafer W from the gas holes 22 of the electrode plate 19 with high uniformity.

Thereafter, the second high-frequency power supply 24 applies high-frequency power of, for example, 13 to 150 MHz to the upper electrode 17. This generates a high-frequency electric field between the upper electrode 17 and the susceptor 8 as the lower electrode, thus generating the plasma of the process gas. The first high-frequency power supply 15 supplies high-frequency power of, for example, 0.1 to 13 MHz to the lower susceptor 8. Accordingly, the active seed in the plasma is drawn toward the susceptor 8, increasing the plasma density in the vicinity of the top surface of the wafer W. The generated plasma progresses the chemical reaction on the top surface of the wafer W, thus forming an SiOF film on the top surface of the wafer W.

After a film with a predetermined thickness is formed, the supply of high-frequency power is stopped and the supply of the process gas is stopped. After the pressure in the chamber 2 is set back to the original pressure, the wafer W is transferred out of the chamber 2 in the order reverse to that of the load-in of the wafer W. This completes the deposition process of the wafer W.

According to the first embodiment, as described above, the upper electrode 17 comprises the gas supply tube 27, the electrode plate 19 and the first diffusion plate 21 provided therebetween. The first diffusion plate 21 has the first channel 30 comprising a plurality of grooves formed radially in one side, and has the first recess 32 formed almost entirely in the other side. The process gas supplied from the gas supply tube 27 is diffused in the first channel 30 in a direction parallel to the major surface of the electrode plate 19, and then supplied to the first recess 32 on the other side. The process gas is further diffused in the first recess 32 and is supplied to nearly uniformly to the multiple gas holes 22. Accordingly, the process gas is supplied from the gas holes 22 with high uniformity, thus ensuring a process with high uniformity which has an excellent film thickness distribution or the like.

The first diffusion plate 21 is comprised of a single plate-like member having a groove or recess formed in its both sides. Therefore, the first diffusion plate 21 can be prepared easily by doing working, such as cutting, on both sides of, for example, a single aluminum plate. Further, a plurality of pipes are not required. Therefore, highly uniform diffusion of the process gas to the gas holes 22 becomes possible easily without complicating the system structure. This can achieve a highly uniform process while preventing an increase in manufacturing cost and reduction in maintenanceability, such as maintenance.

The first embodiment is constructed in such a way that the first diffusion plate 21 is provided with the four first channels 30a and the process gas is supplied to the hollow portion from the four first inlet ports 31a. But, the number of the first inlet ports 31a is not restrictive but the number of the first channels 30a may be set to five or more and the first inlet ports 31a may be provided in the individual first channels 30a. Further, such a structure may be taken that two first inlet ports 31a or more are formed in the first channel 30a. In this case too, the grooves or holes in the first diffusion plate 21 have only be increased and more uniform dispersion of the process gas can be ensured without complicating the system structure.

Second Embodiment

A process system according to the second embodiment has the same structure as the plasma process system 1 illustrated in FIG. 1 except for the upper electrode 17. FIG. 5 shows an exploded diagram of the upper electrode 17 according to the second embodiment. For easier understanding, in FIG. 5, same reference symbols are given to those portions which are the same as those in FIG. 2 and the description will be omitted.

In the second embodiment, the process gas is supplied to the center portion and end portion of a wafer W at the flow rates independently controlled. That is, as shown in FIG. 5, a center-portion gas supply tube 27a and an end-portion gas supply tube 27b are connected to the electrode support 20 and are connected to the common gas supply source 28 respectively via flow-rate control devices 29a and 29b.

The process gases supplied from the center-portion gas supply tube 27a and end-portion gas supply tube 27b respectively are diffused, passing through a center-portion gas passage $L_a$ and end-portion gas passage $L_b$ independent of each other formed in the upper electrode 17, supply tube 27a and end-portion gas supply tube 27b, and are supplied to the center portion and end portion of the electrode plate 19. Accordingly, the process gas is supplied through the gas holes 22 of the electrode plate 19 to the center portion and end portion of the wafer W at the flow rates independently controlled.

The upper electrode 17 in the second embodiment has a second diffusion plate 40 and a third diffusion plate 41 provided between the electrode plate 19 and the electrode support 20. The second and third diffusion plates 40 and 41 are comprised of a disk-like member made of a conductive material such as aluminum. The second and third diffusion plates 40 and 41 have approximately the same diameters as that of the electrode plate 19. The second and third diffusion plates 40 and 41 form the two independent center-portion gas passage $L_a$ and end-portion gas passage $L_b$ in the upper electrode 17.

The second diffusion plate 40 is laid out in such a way as to contact the electrode support 20. The second diffusion plate 40 has a second channel 50 formed in one side as a groove of a given depth, and third and fourth inlet ports 51 and 52 which penetrate the second diffusion plate 40. The second channel 50 and the third and fourth inlet ports 51 and 52 can be formed easily by cutting, drilling or the like.

FIG. 6 shows a diagram of the second diffusion plate 40 shown in FIG. 5 as seen from an arrow C. As shown in FIG. 6, the second channel 50 comprises four second grooves 50a, ..., 50a is formed in one side of the second diffusion plate 40. The second grooves 50a, ..., 50a are connected at nearly the center of the second diffusion plate 40 and extend radially from the center. The second grooves 50a, ..., 50a are formed with almost the same lengths in such a way as to be approximately orthogonal to one another.

The third inlet ports 51 are respectively formed in the second grooves 50a at approximately equidistances from the center. The end-portion gas supply tube 27b is provided in such a way as to supply the process gas to approximately the center of the second diffusion plate 40. Accordingly, the process gas is supplied, evenly dispersed, to the four second grooves 50a, ..., 50a, from the center. The process gas flows through the second grooves 50a and is supplied to the other side of the second diffusion plate 40 from the third inlet ports 51.

The fourth inlet ports 52 are formed at positions that do not overlap the second grooves 50a. The center-portion gas supply tube 27a is laid out in such a way as to be connected to the fourth inlet ports 52. Accordingly, the process gas supplied from the center-portion gas supply tube 27a is supplied to the other side of the first diffusion plate 21 via the fourth inlet ports 52.

Returning to FIG. 5, the third diffusion plate 41 is arranged between the second diffusion plate 40 and the electrode plate 19. The third diffusion plate 41 has a third channel 53 formed in one side facing the second diffusion plate 40 as a groove of a given depth, fifth and sixth inlet ports 54 and 55 which penetrate the third diffusion plate 41, and a second recess 56 formed in that side which faces the electrode plate 19 as a recess of a given depth. The third channel 50, the fifth and sixth inlet ports 54 and 55 and the second recess 56 can be formed easily by cutting, drilling or the like.

The hollow portion that is formed by the second recess 57 is separated to a center portion and an end portion by a partition member 56.

FIG. 7 shows a diagram of the third diffusion plate 41 shown in FIG. 5 as seen from an arrow D. As shown in the diagram, four third grooves 53a, ..., 53a and a single lead-out groove 53b, which constitute the third channel 53, are formed in one side of the third diffusion plate 41. The third grooves 53a, ..., 53a are connected at nearly the center of the third diffusion plate 41 and extend radially from the center. The third grooves 53a are formed with almost the same lengths in such a way as to be approximately orthogonal to one another.

The fifth inlet ports 54 are respectively formed in the third grooves 53a at approximately equidistances from the center. Here, the third grooves 53a have shorter lengths than the second grooves 50a.

The lead-out groove 53b is connected to the third grooves 53a, ..., 53a at the center. One end of the lead-out groove 53b is provided in such a way as to overlap the fourth inlet ports 52 of the second diffusion plate 40. Accordingly, the process gas having supplied from the center-portion gas supply tube 27a and having passed the fourth inlet ports 52 is received at the lead-out groove 53b and flows toward the center. Thereafter, the process gas is dispersed to the third grooves 53a, ..., 53a approximately evenly, and flows to the other side via the fifth inlet ports 54.

The sixth inlet ports 55 are provided, four in quantity, in the third diffusion plate 41. The sixth inlet ports 55 are provided in such a way as to overlap the third inlet ports 51 of the second diffusion plate 40 and communicate with them. Accordingly, the process gas having supplied from the end-portion gas supply tube 27b and having passed the third inlet ports 51 flows to the other side via the sixth inlet ports 55.

FIG. 8 shows a diagram of the third diffusion plate 41 shown in FIG. 5 as seen from an arrow E. As illustrated in the diagram, the second recess 57 is formed in the entire third diffusion plate 41 approximately in a circular shape nearly concentric to the third diffusion plate 41. The second recess 57 is separated into a center area 57a and an end area 57b by the annular partition member 56. The partition member 56 is formed of, for example, aluminum and is constituted by a belt-like member having approximately the same width as the depth of the second recess 57. The annular partition member 56 has approximately the same center as the second recess 57. The partition member 56 separates the hollow portion (second recess 57) formed by the third diffusion plate 41 and the electrode plate 19 to the center area 57a and the end area 57b.

Here, the partition member 56 is provided in such a way that the flat surface of the second recess 57 shown in FIG. 8 is separated into a predetermined area ratio by the center area 57a and the end area 57b. The diameter of the partition member 56 is designed so that, for example, the area of the center area 57a:the area of the end area 57b=2:1. The area mentioned here is substantially the cross-sectional area as seen from a direction perpendicular to the major surface of the third diffusion plate 41.

As mentioned above, the third grooves 53a having the fifth inlet ports 54 are formed shorter than the second grooves 50a having the third inlet ports 51. As shown in FIG. 8, the fifth inlet ports 54 is arranged inside the partition member 56. The sixth inlet ports 55 that communicate with the third inlet ports 51 are arranged outside the partition member 56. Accordingly, the process gas from the fifth inlet ports 54 is supplied to the center area 57a of the second recess 57 while the process gas from the sixth inlet ports 55 is supplied to the end area 57b of the second recess 57.

In short, referring to FIG. 5, the center-portion gas passage $L_a$ and the end-portion gas passage $L_b$ independent of each other are formed in the upper electrode 17 by the second and third diffusion plates 40 and 41. As the process gas supplied from the center-portion gas supply tube 27a passes through the center-portion gas passage $L_a$, the gas is diffused in a direction horizontal to the major surface of the diffusion plate 19 as indicated by the arrow of a one-dot chain line and is ejected to the center portion of the wafer W from the gas holes 22 that communicate with the center area 57a. As the process gas supplied from the end-portion gas supply tube 27b passes through the end-portion gas passage $L_b$, the gas is diffused as indicated by the arrow of a dotted line and is ejected to the end portion of the wafer W from the gas holes 22 that communicate with the end area 57b.

The process gas is supplied to the center-portion gas passage $L_a$ and the end-portion gas passage $L_b$ independent of each other at flow rates controlled by the flow-rate control devices 29a and 29b. Therefore, it is possible to supply the process gas, with the flow rate controlled, to the center portion and end portion of the wafer W.

Figure 9:
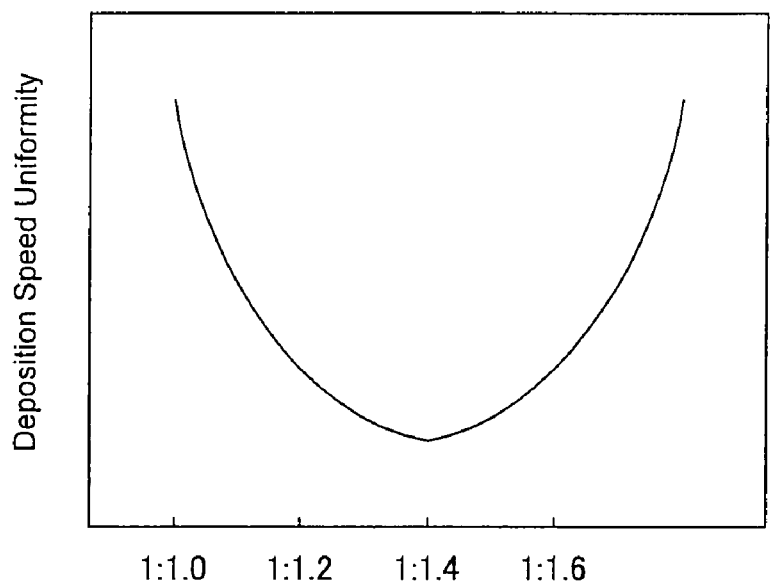
FIG. 9 is a graph showing the results of checking the supply amount ratio of a process gas and the uniformity of the deposition speed.

FIG. 9 shows the results of checking the uniformity of the deposition speed on the top surface of the wafer W while changing the supply amount ratio of the process gas to the center area 57a and the end area 57b by means of the flow-rate control devices 29a and 29b with the area ratio (cross-sectional ratio) of the center area 57a to the end area 57b set to 2:1.

As apparent from FIG. 9, the deposition speed shows a good uniformity when the gas supply amount ratio of the process gas to the center area 57a and the end area 57b is 1:1.2 to 1.6, and the best uniformity particularly near 1:1.4. The uniformity of the deposition speed indicates the degree of a variation in deposition speed at the top surface of the wafer W, and as the value is lower, the variation is lower and deposition with a higher in-plane uniformity is carried out. In case where the area ratio of the center area 57*a* to the end area 57*b* is 2:1, therefore, setting the gas supply amount ratio of the center area 57*a* to the end area 57*b* to near 1:1.4 can ensure a process with an excellent film thickness distribution and high uniformity.

Figure 10:
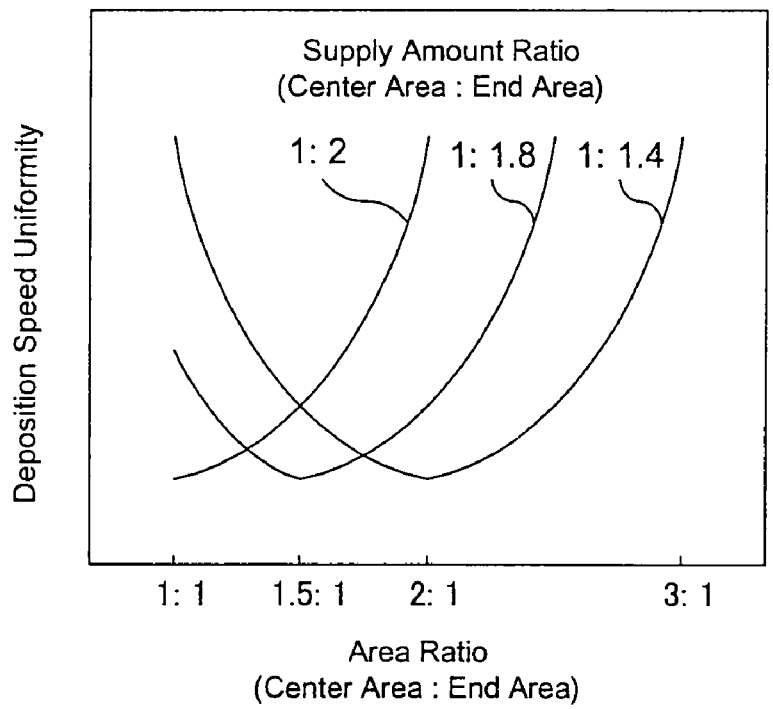
FIG. 10 is a graph showing the results of checking the uniformity of the deposition speed when the supply amount ratio of the process gas and the area ratio are mutually changed.

The gas supply can be controlled better by adjusting the diameter of the partition member 56 placed in the second recess 57. FIG. 10 shows the results of checking the uniformity of the deposition speed while changing the area ratio of the individual areas 57*a* and 57*b* with the gas supply amount ratio of the process gas to the center area 57*a* and the end area 57*b* being constant.

FIG. 10 shows the results when the area ratio is changed with the gas supply amount ratio set to 1:1.4, 1:1.8 and 1:2. It is apparent from FIG. 10 that the optimal area ratio when the gas supply amount ratio is 1:1.4 is around 2:1. Likewise, when the gas supply amount ratio is 1:1.8, the optimal area ratio is about 1.5:1 and when the gas supply amount ratio is 1:2, it is about 1:1. It is understood from the above that the optimization can be achieved by adjusting the area ratio and the supply amount ratio in such a way as to provide the desired resultant work.

EXAMPLES

Process conditions that provided the best uniformity, such as deposition speed uniformity, were studied for various films. The results are shown in FIG. 11. In FIG. 11, $SiO_2$, SiOF, SiC, SiN, SiCN, CF*x, SiCH and SiCO were studied. The gas seeds are not limited to those in the diagram, but $SiH_4$ may be substituted with TEOS or the like, $SiF_4$ may be substituted with $Si_2H_2F_2$ or the like, $CH_4$ may be substituted with $C_2H6$ or the like, $C_6F_6$ may be substituted with $CF_4$ or the like, $N_2$ may be substituted with $N_2O$, NO or the like, $O_2$ may be substituted with $N_2O$, $CO_2$ or the like, and 3MS (trimethylsilane) may be substituted with methylsilane, dimethylsilane or the like. The substitutable gases are shown in FIG. 12.

As shown in FIG. 11, the process condition can be optimized according to the deposition seeds by adequately changing the ratio of the center area to the end area.

According to the second embodiment, as described above, the second recess 57 that is connected to the gas holes 22 is separated into the and the center-portion gas passage $L_a$ and the end-portion gas passage $L_b$ center area 57*a* and the end area 57*b*, which are respectively connected to the center area 57*a* and the end area 57*b*, are formed in the upper electrode 17. The process gases are diffused, as they flows through the center-portion gas passage $L_a$ and the end-portion gas passage $L_b$, and are independently controlled to be supplied to the center area 57*a* and the end area 57*b*. The process gases are further diffused in the center area 57*a* and the end area 57*b* and are ejected onto the center portion and end portion of the wafer W through the gas holes 22. Accordingly, the supply of the process gas to the wafer W is controlled well, thus ensuring a process with high uniformity.

The above-described structure is formed by two disk-like members in which grooves and through holes are formed. It is therefore possible to achieve a process with high uniformity without complicating the system structure and while preventing the an increase in manufacturing cost and the degradation of the maintainability, such as maintenance. Further, the boundary between the center area 57*a* and the end area 57*b* can be changed by changing the diameter of the partition member 56. Changing the two areas this way can control the supply of the process gas with a higher accuracy.

In the second embodiment, the same gas seeds are let to flow in the gas passages $L_a$ and $L_b$ independent of each other. However, other types of gases which are not desirably to be mixed in other than the process space may be let to flow in the gas passages $L_a$ and $L_b$, respectively. The gas passages are not limited to two, but three or more may be formed.

In the second embodiment, the second grooves 50*a* and the third grooves 53*a*, each four in quantity, are formed. However, five or more of each type may be provided to further diffuse the process gas. The center area 57*a* and the end area 57*b* are supplied with the gases from the four fifth inlet ports 54, 55, respectively. This is not however restrictive but the quantity may be set to five or more.

In the second embodiment, the hollow portion 57 is separated into two areas by the single partition member 56. However, it may be separated into three or more areas with different cross-sectional ratios by using a plurality of partition members with different inside diameters. The separation of the hollow portion 57 is not limited to this case, but the hollow portion 57 may be separated by a plurality of plate-like members arranged above the diameter of the hollow portion 57.

In the second embodiment, the ratio between the amounts of gas to be supplied to the center area 57*a* and the end area 57*b* is adjusted in order to form a one-layer film having a uniform thickness. The invention is not limited to this example, but is also effective in case of forming a plurality of films by depositing the films so as to have uniform thicknesses respectively while using the same CVD system.

Figure 13:
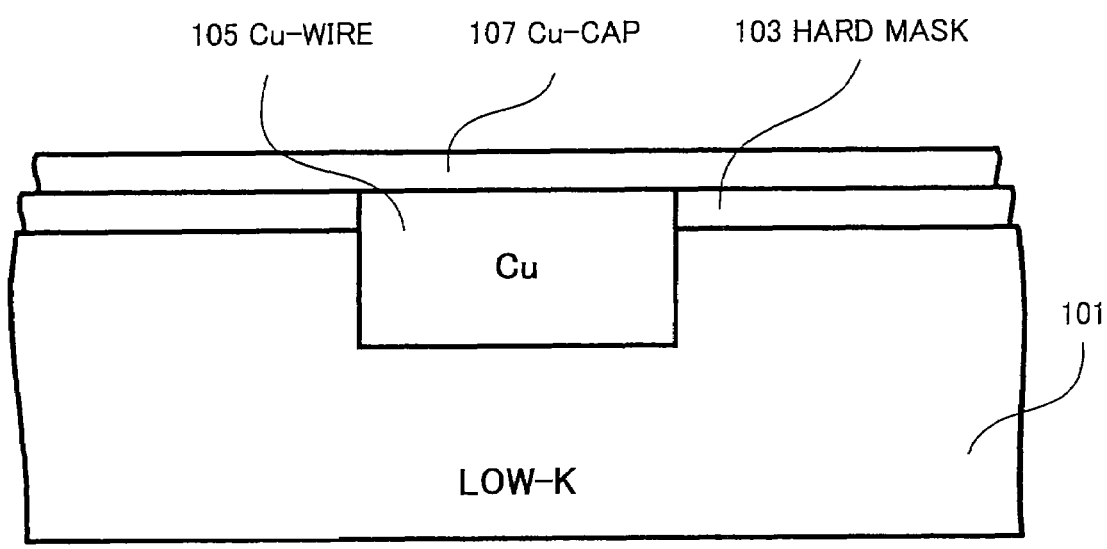
FIG. 13 is a diagram showing an example of a cross section of a semiconductor device having a copper wiring.

For example, the invention is applicable to a case where as shown in FIG. 13, a copper wiring 105 is embedded in an insulation layer made of an insulation film 101 having a low dielectric ratio and a hard mask 103 having a high hardness and a cap layer 107 for preventing diffusion of the copper is then formed on the copper wiring 105.

Figure 14A:
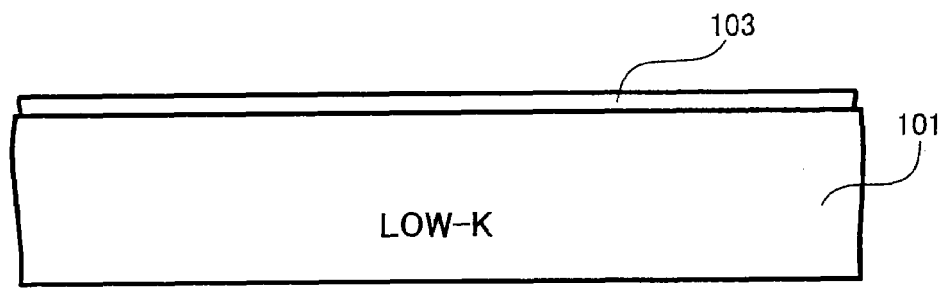
FIGS. 14A to 14D are diagrams for explaining a process for forming the semiconductor device shown in FIG. 13.

In this case, as shown in FIG. 14A for example, a film having a low dielectric ratio, such as a SiCHO film 101, is formed first. Then, a film having a high hardness, such as a SiCH film 103, is formed on the SiCHO film 101.

Figure 14B:
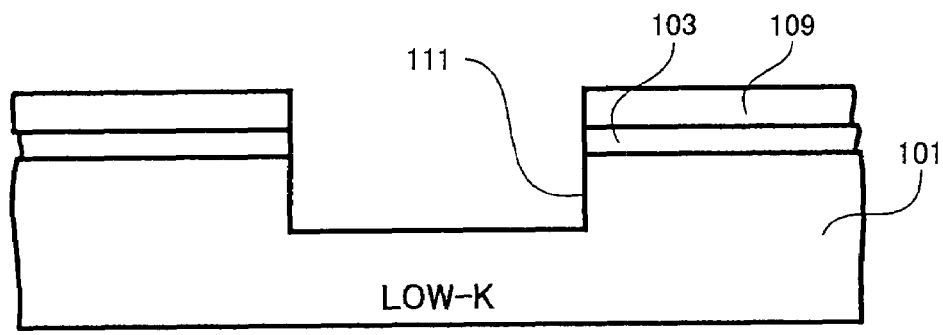

Next, as shown in FIG. 14B, a photo mask 109 is formed. With the photo mask 109 as an etching mask, the SiCHO film 101 and the SiCH film 103 are etched, forming a groove 111 for embedding a wiring therein.

Figure 14C:
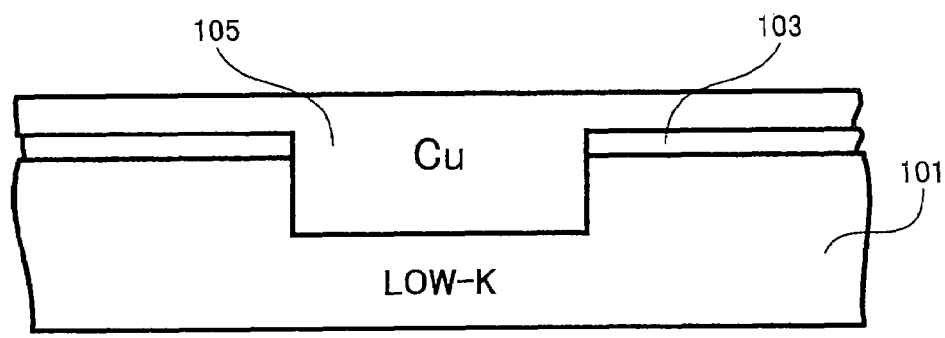

A seed layer made of copper is then formed on the entire top surface of the resultant work by sputtering or the like. Then, as shown in FIG. 14C, with the seed layer as a seed, a copper film 105 is formed by plating the seed layer with copper.

Next, a wiring layer embedded in the groove 111 is formed by polishing the copper film 105 by CMP while using the hard mask 103 as a stopper.

Then, a cap film 107 for preventing diffusion of the copper is formed.

By appropriately adjusting the ratio between the amounts of gas to be supplied to the center area 57*a* and the end area 57*b* by controlling the flow-rate control devices 29*a* and 29*b* while performing the above-described series of processes, it is possible to form the LOW-k film 101, the hard mask 103, and the cap film 107 as uniform films respectively.

In an experiment, a wafer was set in a CVD system comprising an upper electrode having the structure shown in FIG. 5. Then, a film forming process was performed for approximately 9 minutes by supplying 3MS (trimethylsilane) with a flow rate of 3:1 (75 sccm:25 sccm), helium He with a flow rate of 1:1 (150 sccm:150 sccm), and oxygen O2 with a flow rate of 1:1 (7.5 sccm:7.5 sccm) to the center area and the peripheral area, by supplying high-frequency alternating-current powers of 400 W and 0 W to the upper electrode and the lower electrode respectively, and by setting the pressure to 4.5 Torr and the temperature to 350° C., as shown in FIG. 15. As a result, a film having approximately 5000 Angstrom could be formed as the LOW-k film with unification of 4%.

Then, using the same CVD system, a film forming process was performed for approximately 1.5 minutes by supplying 3MS with a flow rate of 4:1 (80 sccm:20 sccm), and helium He with a flow rate of 1:1 (150 sccm:150 sccm) to the center area and the peripheral area, by supplying powers of 400 W and 0 W to the upper electrode and the lower electrode respectively, and by setting the pressure to 4.5 Torr and the temperature to 350° C. As a result, a film having approximately 500 Angstrom could be formed as the hard mask with unification of 2.1%.

Figure 14D:
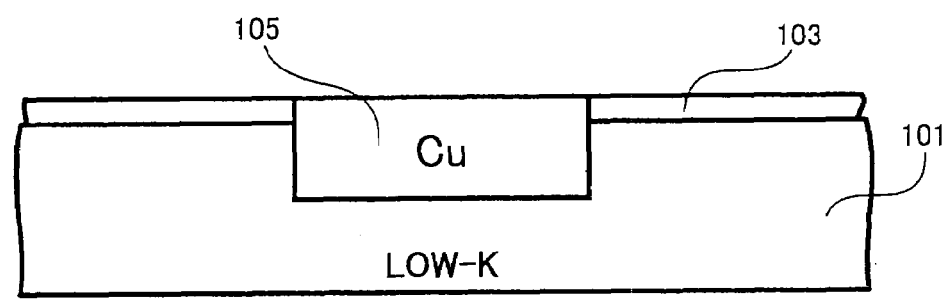

Then, the wafer was once transferred out of the chamber into another system, wherein formation of the copper film 105 and CMP were performed, forming the structure shown in FIG. 14D.

The obtained structure was again set in the above CVD system. Then, a film forming process was performed for approximately 1.0 minute by supplying 3MS with a flow rate of 2:1 (200 sccm:100 sccm), helium He with a flow rate of 1:1 (300 sccm:300 sccm), and ammonia NH3 with a flow rate of 1:1 (40 sccm:40 sccm) to the center area and the peripheral area, by supplying high-frequency powers of 700 W and 0 W to the upper electrode and the lower electrode respectively, and by setting the pressure to 2.9 Torr and the temperature to 350° C. As a result, a film having approximately 500 Angstrom could be formed as the cap film with unification of 2.5%.

As described above, according to the present embodiment, in a case where a plurality of films are formed using the same CVD system by changing process gases and process conditions, films having uniform thicknesses can be formed with the deposition speed for each film kept uniform, by controlling the flow rate of gases between the center area and the end area.

Third Embodiment

Figure 16:
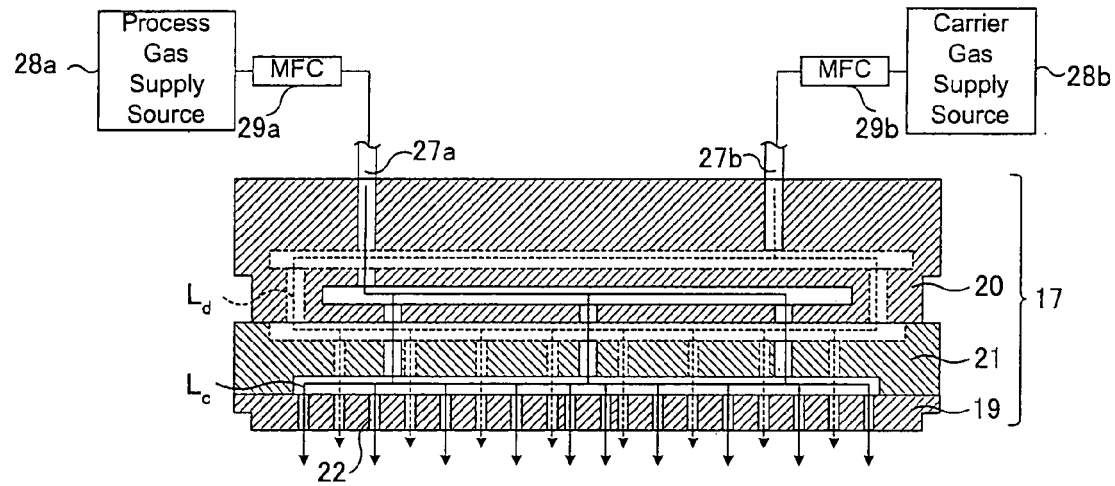
FIG. 16 shows an enlarged diagram of an upper electrode according to a third embodiment.

A process system according to the third embodiment has the same structure as the plasma process system 1 illustrated in FIG. 1 except for the upper electrode 17. FIG. 16 shows an enlarged diagram of the upper electrode 17 according to the second embodiment. For easier understanding, in FIG. 16, same reference symbols are given to those portions which are the same as those in FIG. 2 and the description will be omitted.

Figure 17:
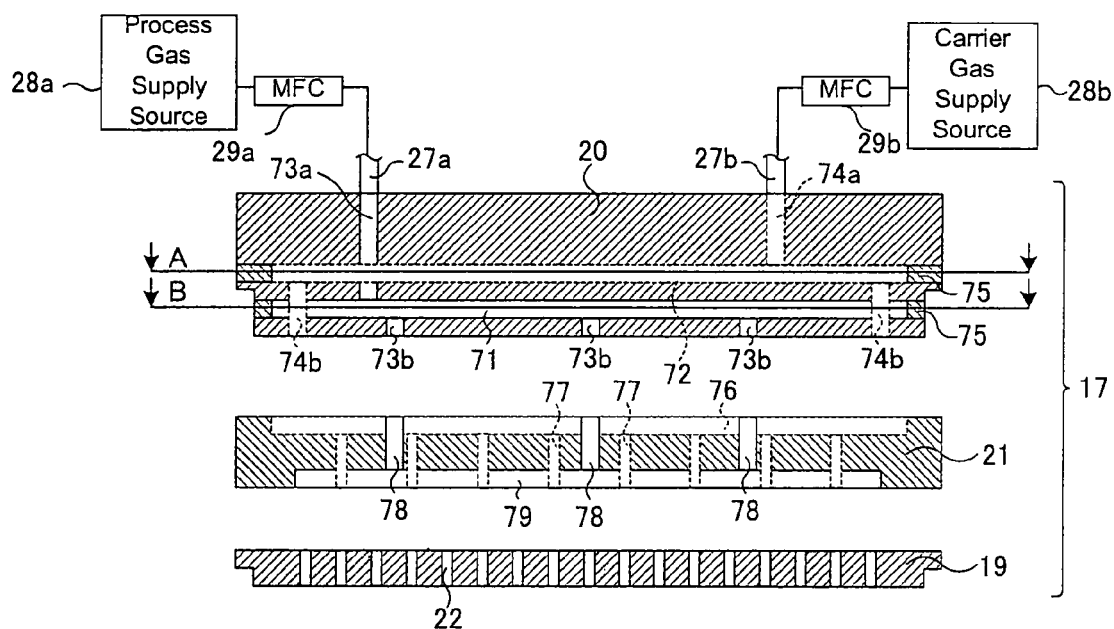
FIG. 17 is an exploded diagram of an upper electrode shown in FIG. 16.

The plasma process system 1 according to the third embodiment has such a structure that a process gas and a carrier gas are diffused without contacting each other and are ejected from the gas holes 22. That is, as shown in FIG. 17, the upper electrode 17 is provided with a process gas supply tube 27a and a carrier gas supply tube 27b, which are respectively connected to the flow-rate control devices 29a and 29b and a press gas supply source 28a and a carrier gas supply source 28b. Here, a mixture of various gases which have been used conventionally for deposition of an SiOF film, such as $SiF_4$, $SiH_4$, $O_2$, $NF_3$ and $NH_3$, is supplied from the process gas supply source 28a and an Ar gas is supplied from the carrier gas supply source 28b.

Formed in the upper electrode 17 are two gas passages $L_c$ (solid-line arrow) and $L_d$ (broken-line arrow) which respectively start from the process gas supply tube 27a and carrier gas supply tube 27b. The gas passage $L_c$ and $L_d$ are formed independently of each other and the process gas and carrier gas are diffused as they pass through the gas passage $L_c$ and $L_d$, and are supplied approximately uniformly to the wafer W from the multiple gas holes 22 of the electrode plate 19.

An exploded diagram of the upper electrode 17 is shown in FIG. 17. The upper electrode 17 has such a structure that a disk-shaped diffusion plate 21 is sandwiched between the cylindrical electrode support 20 and the electrode plate 19.

Formed inside the electrode support 20 are two hollow portions 71 and 72 extending horizontally with respect to the major surface thereof as shown in FIG. 17. The two hollow portions 71 and 72 are laid out in such a way that their distances from the major surface of the electrode support 20 differ from each other.

Of the two hollow portions 71 and 72, the first hollow portion 71 closer to the diffusion plate 21 is connected with seventh and eighth inlet ports 73a and 73b. The seventh inlet port 73a extends from the first hollow portion 71 in a direction perpendicular to the major surface of the electrode support 20 (the upper direction in the diagram) and communicates with the process gas supply tube 27a. The eighth inlet ports 73b extend from the first hollow portion 71 in the opposite direction (the lower direction in the diagram) to the seventh inlet port 73a and communicate with the bottom-side space of the electrode support 20. Accordingly, the process gas supplied from the process gas supply tube 27a flows through the gas passage $L_c$ which is constituted by the seventh inlet port 73a, the first hollow portion 71 and the eighth hollow portions 73b.

The second hollow portion 72 formed farther from the diffusion plate 21 is connected with ninth and tenth inlet ports 74a and 74b. The ninth inlet port 74a extends from the second hollow portion 72 in a direction perpendicular to the major surface of the electrode support 20 (the upper direction m the diagram) and communicates with the carrier gas supply tube 27b. The tenth inlet ports 74b extend from the second hollow portion 72 in the opposite direction (the lower direction in the diagram) to the ninth inlet port 74a and communicate with the bottom-side space of the electrode support 20. Accordingly, the carrier gas supplied from the carrier gas supply tube 27b flows through the gas passage $L_d$ which is constituted by the ninth inlet port 74a, the second hollow portion 72 and the tenth hollow portions 74b.

FIG. 18 shows a cross-sectional view of the electrode support 20 shown in FIG. 17 as seen from an arrow A. As shown in the diagram, the second hollow portion 72 comprises four first linear holes 72a, . . . , 72a extending radially from approximately the center of the electrode support 20, and a second linear hole 72b provided radially from the same center between adjoining two first linear holes 72a. The first linear holes 72a, . . . , 72a are provided in such a way as to be approximately orthogonal to one another. The first and second linear holes 72a and 72b are provided on approximately the same plane.

The individual first linear holes 72a are connected to the tenth inlet ports 74b at points approximately equidistant from the center. The second linear hole 72b communicates with the ninth inlet port 74a.

The carrier gas supplied from the carrier gas supply tube 27b passes the ninth inlet port 74a and flows to the second linear hole 72b. The carrier gas travels in the second linear hole 72b toward the center and is dispersed to the four first linear holes 72a from the center. Accordingly, the carrier gas is diffused horizontally. The carrier gas that has passed the first linear holes 72a flows toward the diffusion plate 21 from the tenth inlet ports 74b.

The seventh inlet port 73a which connects to the process gas supply tube 27a is formed at such a position as not to overlap the second hollow portion 72.

FIG. 19 shows a cross-sectional view of the upper electrode 17 shown in FIG. 17 as seen from an arrow B. As shown in FIG. 19, the first hollow portion 71 comprises four third linear holes 71a, . . . , 71a extending radially from approximately the center thereof, and a fourth linear hole 71b extending radially from the same center between adjoining two third linear holes 71a The third linear holes 71a, . . . , 71a are formed in approximately the same plane in such a way as to be nearly orthogonal to one another. The third and fourth linear holes 71a and 71b are provided at such a position as not to overlap the tenth inlet ports 74b.

The individual third linear holes 71a are connected to the eighth inlet ports 73b at points approximately equidistant from the center and at the center. The fourth linear hole 71b communicates with the seventh inlet port 73a.

The process gas supplied from the process gas supply tube 27a passes the seventh inlet port 73a and flows to the fourth linear hole 71b. The process gas travels in the fourth linear hole 71b toward the center and is dispersed to the four third linear holes 71a from the center. The process gas is diffused horizontally in this manner. The process gas that has passed the third linear holes 71a flows toward the diffusion plate 21 from the eighth inlet ports 73b.

The linear holes 71a, 71b, 72a and 72b that constitute the first and second hollow portions 71 and 72 are formed by boring holes of a predetermined depth from the side wall of the electrode support 20 toward the center and sealing the end portions with sealing members 75.

For example, the linear holes are formed by boring holes in the side wall of the electrode support 20 from a approximately perpendicular direction toward the center thereof by a gun drill. The boring by the gun drill is performed plural times, for example, by tuning the electrode support 20 around its center. Accordingly, a plurality of linear holes which communicate with one another at the center are formed. Thereafter, the end portions of the formed linear holes are sealed with the sealing members 75 made of the same material as the electrode support 20, thereby forming hollow portions. Here, the first and second hollow portions 71 and 72 can be formed easily by changing, for example, the relative positions of the gun drill and the electrode support 20. The electrode support 20 with the above-described structure can be formed by forming holes (inlet ports) in the major surface of the electrode support 20 from the perpendicular direction in such a way as to reach the thus formed linear holes.

Returning to FIG. 17, a fourth channel 76 is formed in that side of the diffusion plate 21 which faces the electrode support 20. The fourth channel 76 is comprised of a plurality of grooves and forms a hollow portion with the bottom of the electrode support 20 covered. The fourth channel 76 is provided in such a way as to communicate the tenth inlet ports 74b but not to communicate eighth inlet ports 73b. Multiple first through ports 77 which penetrate the diffusion plate 21 are formed in the fourth channel 76 and are provided in such a way as to communicate with the gas holes 22, respectively.

The fourth channel 76 and the first through ports 77 constitute the gas passage $L_d$ where the carrier gas flows. The carrier gas supplied to the diffusion plate 21 through the tenth inlet ports 74b is diffused horizontally by the fourth channel 76, passes through the first through ports 77 and is ejected from the multiple gas holes 22 approximately uniformly.

Second through ports 78 are provided in the diffusion plate 21, penetrating it, in such a way as to communicate with the eighth inlet ports 73b. A fifth channel 79 is provided in that side of the diffusion plate 21 which faces the electrode plate 19. The fifth channel 79 is comprised of a plurality of grooves and forms a hollow portion with the top of the electrode plate 19 covered. The fifth channel 79 is provided in such a way as to communicate the second through ports 78 but not to communicate first through ports 77.

The second through ports 78 and the fifth channel 79 constitute the gas passage $L_c$ where the process gas flows. The process gas supplied to the diffusion plate 21 through the eighth inlet ports 73b passes through the first through ports 77 and is diffused horizontally in the fifth channel 79. As the fifth channel 79 communicates with the multiple gas holes 22, the diffused process gas is supplied from the gas holes 22 approximately uniformly.

Here, the multiple gas holes 22 in the diffusion plate 19 are connected to either the first through ports 77 or the fifth channel 79 in the same quantity, for example. Accordingly, the process gas which passes through the gas passage $L_c$ and the carrier gas which passes through the gas passage $L_d$ are diffused horizontally without contacting each other and are ejected through the gas holes 22 approximately uniformly. The process gas and the carrier gas are mixed inside the chamber 2 for the first time and are supplied onto the wafer W to be a plasma.

The upper electrode 17 in the third embodiment has the following advantages. That is, the diffusion areas (first and second hollow portions 71 and 72) for diffusing a gas to be used in the process are formed by making holes in the electrode support 20 using a gun drill or the like. As the diffusion areas are formed inside the electrode support 20 this way, a process with high uniformity can be carried out with uniform gas supply from the gas holes 22 without increasing the number of parts or without complicating the system structure.

As the number of parts is not increased, the interface present in the upper electrode 17 (e.g., the interface between the electrode support 20 and the diffusion plate 21) is not increased. This therefore prevents loss of high-frequency power originated from an increase in the skin effect that is caused by an increase of the interface.

In the third embodiment, the two independent gas passages $L_c$ and $L_d$ which do not communicate with each other are formed inside the upper electrode 17. If necessary, however, three gas passages or more may be provided in the upper electrode 17. In this case, for example, the number of hollow portions inside the electrode support 20 should be set to three layers of hollow portions or more by changing the distances from one side of the electrode support 20 respectively.

In the third embodiment, the process gas is let to flow in the gas passage $L_c$ and the carrier gas is let to flow in the gas passage $L_d$. However, gases which are not desirable to be mixed outside the chamber, e.g., an inflammable and flame-aiding gas, may be let to flow in the gas passages $L_c$ and $L_d$, respectively.

In the third embodiment, each of the first and second hollow portions 71 and 72 in the electrode support 20 is comprised of four linear holes. The number of linear holes is not limited to this number but may be set to five or more for better diffusion of the gases. The method of forming the linear holes in the upper electrode 17 is not limited to boring by a gun drill but boring may be performed by a laser or the like. Further, although the linear holes are formed with the depth from the side wall of the electrode support 20 to the center, they may be formed all the way through the electrode support 20.

In the first to third embodiments, the upper electrode 17 is made of aluminum. However, the material for the upper electrode 17 is not limited to this material but conductive materials other than those which adversely influence the process, such as SUS, can be used as well.

Although $SiF_4$, $SiH_4$, $O_2$, $NF_3$, $NH_3$ gases and an inactive gas, such as Ar or nitrogen, are used to deposit an SiOF film on a wafer in the first to third embodiments, the gases in use are not limited to them. A film to be deposited may be any film, such as an $SiO_2$ film, SiC film, SiN film, SiOC film or CF film.

The invention is not limited to a system for a plasma CVD process but can be adapted to a system which performs a thermal CVD process, etc., as long as they supply a process gas from that side which faces the major surface of a subject to be processed via a shower-head type plate-like member and processes the to-be-processed subject, and can further be adapted to other systems which perform various processes, such as a deposition process, an etching process and a thermal process. Further, the to-be-processed subject is not limited to a semiconductor wafer but may be a glass substrate or the like for a liquid crystal display device.

The invention can be suitably used for fabrication of a process system which carries out a deposition process, an etching process, etc. on a subject to be processed, such as a semiconductor wafer.

The contents of the cited reference are incorporated herein by reference in their entirety.

This application is based on International Patent Application No. PCT/JP02/00429 filed on Jan. 22, 2002 and an amendment under Patent Cooperation Treaty Article 34 filed for the above-noted International Patent Application, Japanese Patent Application No. 2001-13570 filed on Jan. 22, 2001 and Japanese Patent Application No. 2001-14011 filed on Jan. 23, 2001. The disclosure of the above-noted Patent Applications and the amendment are incorporated herein by reference in their entirety.

What is claimed is:

1. A process system comprising:
   a chamber;
   a supply plate which has a plurality of gas holes and supplies a process gas into said chamber through said gas holes;
   a first diffusion portion which diffuses said gas in a direction approximately parallel to a major surface of said supply plate; and
   a second diffusion portion which leads said gas diffused by said first diffusion portion to said gas holes, said second diffusion portion comprised of a second disk, wherein said second diffusion portion is placed over said supply plate to form a hollow portion between said second disk and said supply plate such that said gas can be supplied from said first diffusion portion to said hollow portion; and
   said process system further comprising a partition member in said hollow portion which separates said hollow portion into a center area and an end area, and a gas supply portion comprising mutually independent gas flow passages, wherein a first gas flow passage passes through said first disk and said second disk via a plurality of grooves formed in one side of said second disk in fluid communication with each other and extending radially from approximately the center of the second disk, a first one of said grooves being in fluid communication with a through hole located in said first disk at an end portion of said first groove, and the remaining grooves having through holes formed therein, and supplies said gas via first through holes exclusively to said center area of the supply plate, and a second gas flow passage supplies said gas that is diffused by said first diffusion portion via second through holes and said second diffusion portion exclusively to said end area of the supply plate, wherein the gas flow rates in the mutually independent gas flow passages are independently controlled, a first gas flows from the center area of the hollow portion through the supply plate to a center area of the process chamber, and a second gas flows from the end area of the hollow portion through the supply plate to an end area of the process chamber such that the gases do not mix prior to entering the process chamber, and first and second gas flow passages are separate.

2. The process system according to claim 1, wherein said first disk comprises a plurality of grooves formed in one side thereof and communicating with one another and through holes formed in said plurality of grooves and led to the other side.

3. The process system according to claim 2, wherein at least one of said grooves in said first disk are provided at positions to which said gas is supplied, and said gas supplied to said at least one groove is dispersed to the other grooves in said first diffusion portion and flows out to the other side through said through holes respectively provided in said other grooves.

4. The process system according to claim 1, wherein said first diffusion portion is comprised of a cylindrical member having a plurality of linear holes communicating with one another, formed by boring and sealing end portions of bored portions, at least one of said holes is supplied with said gas and said gas supplied to said at least one hole is dispersed to the other holes.

5. The process system according to claim 4, wherein said cylindrical member has connection holes provided in such a way as to be in communication with said linear holes from its one side, and said gas supplied to said linear holes is supplied to said second diffusion portion from said connection holes.

6. The process system according to claim 4, wherein said first diffusion portion has a plurality of cylindrical members, and each cylindrical member comprises said plurality of linear holes formed from a sidewall of said cylindrical members toward a center thereof.

7. The process system according to claim 6, wherein said cylindrical members respectively constitute gas flow passages independent from each other.

8. The process system according to claim 1, wherein a linear gas flow passage approximately parallel to a major surface of said supply plate is formed in said first diffusion portion, and said gas is diffused in a direction approximately parallel to the major surface of said supply plate.

9. The process system according to claim 1, wherein each mutually independent gas flow passage is adapted to receive said process gas from a common gas supply source.

10. The process system according to claim 1, wherein the gas flow rates into the chamber are independently controlled.

11. A process system comprising:
   a chamber;
   a supply plate which has a plurality of gas holes and supplies a process gas into said chamber through said gas holes;
   a first diffusion portion located in a first disk which diffuses said gas in a direction approximately parallel to a major surface of said supply plate; and
   a second diffusion portion located in a second disk which leads said gas diffused by said first diffusion portion to said gas holes;
   wherein a plurality of grooves are formed in one side of said second disk in fluid communication with each other and extending radially from approximately a center of the second disk, an end portion of a first one of said grooves being in fluid communication with a through hole located in said first disk, and the remaining grooves having through holes formed therein, and a first independent gas flow passage supplies said process gas only into a center area of said chamber via said plurality of grooves, and first gas holes, and a second independent gas flow passage supplies said process gas only into an end area of said chamber via said first diffusion portion, second gas holes, and said second diffusion portion, where in the first independent gas flow passage and the second independent gas flow passage are each formed in said first disk and in said second disk and the process gas in the first independent gas flow passage and the process gas in the second independent gas flow passage do not mix before flowing into said chamber.

12. The process system according to claim 11, wherein the process gas flow rates in the mutually independent gas flow passages are independently controlled.

* * * * *